United States Patent [19]

Okahashi et al.

[11] Patent Number: 4,994,902
[45] Date of Patent: Feb. 19, 1991

[54] SEMICONDUCTOR DEVICES AND ELECTRONIC SYSTEM INCORPORATING THEM

[75] Inventors: Tatsuo Okahashi, Sayama; Masao Naito, Iruma; Atsushi Hasegawa; Norio Nakagawa, both of Koganei, all of Japan

[73] Assignees: Hitachi, Ltd.; Hitachi Microcomputer Engineering Ltd., both of Tokyo, Japan

[21] Appl. No.: 437,373

[22] Filed: Nov. 15, 1989

[30] Foreign Application Priority Data

Dec. 5, 1988 [JP] Japan .................................. 63-308522
Nov. 30, 1988 [JP] Japan .................................. 63-300780

[51] Int. Cl.$^5$ .................... H01L 39/02; H01L 23/02; H01L 23/12; H01L 23/16
[52] U.S. Cl. .............................. 357/80; 357/74; 357/75; 361/404; 361/409
[58] Field of Search ....................... 357/80, 74, 72, 70, 357/75; 361/404, 409; 174/52.4; 364/131, 200

[56] References Cited

U.S. PATENT DOCUMENTS

| 4,784,970 | 11/1988 | Solomon | 437/51 |
| 4,794,092 | 12/1988 | Solomon | 437/51 |
| 4,847,732 | 7/1989 | Stopper et al. | 361/395 |

OTHER PUBLICATIONS

Nikkei Electronics, Jul. 13, 1987, pp. 136-138.

Primary Examiner—Rolf Hille
Assistant Examiner—D. Ostrowski
Attorney, Agent, or Firm—Fay, Sharpe, Beall, Fagan, Minnich & McKee

[57] ABSTRACT

An electronic system having a first and a second semiconductor device acting as a microprocessor and a coprocessor, respectively, disposed linearly on a mounting board. The external pins common to both the first and the second semiconductor device are connected by wiring means installed linearly on the mounting board.

23 Claims, 8 Drawing Sheets

FIG. 6

| | A | B | C | D | E | F | G | H | J | K | L | M | N | P |
|---|---|---|---|---|---|---|---|---|---|---|---|---|---|---|
| 1 | Vss | Vss | A8 | A11 | A13 | A14 | A16 | A17 | Vss | A20 | A23 | A25 | A26 | Vss |
| 2 | A2 | A3 | A5 | A7 | A10 | Vcc | A15 | Vss | A19 | A21 | Vcc | A27 | Vss | RESET |
| 3 | Vcc | A0 | A1 | A4 | A6 | A9 | A12 | A18 | A22 | A24 | A28 | IRL0 | IRL1 | IRL2 |
| 4 | BC2 | BC1 | BC0 | | | | | | | | A29 | PURGE | HACK | HREQ |
| 5 | R/W | BS | BC3 | | | | | | | | | GBR | Vcc | NC |
| 6 | BAT2 | NCA | LOC | | | | | | | | | NC | NC | NC |
| 7 | BAT1 | BAT0 | Vss | | | | | | | | | Vss | CLKf | NC |
| 8 | Vss | Vss | Vcc | | | | | | | | | Vcc | Vss | CLK2f |
| 9 | FLOAT | HALT | CDE | | | | | | | | | NC | NC | Vss |
| 10 | DS | DCT | CPDC | | | | | | | | | RNG | NC | NC |
| 11 | Vcc | DC | BST | D0 | D4 | D6 | D10 | D16 | D19 | D22 | D25 | D31 | NC | ASDC |
| 12 | AS | CPST2 | CPST1 | D1 | D7 | D9 | Vss | D15 | D17 | D18 | D24 | D29 | Vcc | D30 |
| 13 | CPST0 | Vss | D2 | D5 | D11 | Vss | D12 | D13 | D14 | Vcc | D21 | Vss | D27 | D28 |
| 14 | Vss | D3 | Vcc | D8 | | Vss | | | | | D20 | D23 | Vss | D26 |

: COPROCESSOR SIGNAL
: DATA BUS SIGNAL

FIG. 7

Legend:
- ▓ (dotted): COPROCESSOR SIGNAL
- ▨ (hatched): DATA BUS SIGNAL

| | P | N | M | L | K | J | H | G | F | E | D | C | B | A |
|---|---|---|---|---|---|---|---|---|---|---|---|---|---|---|
| 1 | Vcc | NC | Vss | Vcc | Vss | D9 | D8 | Vss | D6 | Vcc | Vss | Vcc | Vss | Vss |
| 2 | $\overline{RESET}$ | Vss | NC | D14 | D12 | D11 | Vcc | D7 | D4 | D3 | D1 | A28 | Vcc | A29 |
| 3 | CPID0 | UD | LD | Vss | D15 | D13 | D10 | D5 | D2 | D0 | Vss | $\overline{BC0}$ | A27 | $\overline{HACK}$ |
| 4 | Vss | CPID2 | CPID1 | Vcc | | | | | | | | $\overline{BC3}$ | $\overline{BC1}$ | $\overline{BC2}$ |
| 5 | SIZ16 | Vcc | $\overline{IRL}$ | | | | | | | | | Vss | $\overline{BS}$ | R/$\overline{W}$ |
| 6 | NC | Vcc | Vss | | | | | | | | | BAT2 | Vcc | BAT0 |
| 7 | Vcc | Vss | Vss | | | | | | | | | Vcc | BAT1 | Vss |
| 8 | Vcc | $\overline{CLKf}$ | Vcc | | | | | | | | | Vcc | Vss | NC |
| 9 | Vss | Vcc | Vcc | | | | | | | | | $\overline{RETRY}$ | $\overline{CDE}$ | Vss |
| 10 | NC | Vss | Vcc | NC | D30 | D29 | Vcc | D22 | D20 | D18 | Vss | $\overline{DC}$ | $\overline{CPDC}$ | Vss |
| 11 | Vcc | Vcc | Vcc | Vss | D28 | D27 | Vss | D24 | Vcc | D21 | D16 | CPST1 | $\overline{BERR}$ | Vcc |
| 12 | Vcc | Vss | Vcc | Vss | Vss | D26 | Vcc | D25 | Vss | D23 | D19 | D17 | CPST2 | Vss |
| 13 | NC | Vcc | Vcc | Vcc | | | | | | | | Vss | Vss | CPST0 |
| 14 | Vcc | Vss | D31 | | | | | | | | | Vcc | Vcc | Vcc |

SEMICONDUCTOR DEVICES AND ELECTRONIC SYSTEM INCORPORATING THEM

BACKGROUND OF THE INVENTION

The present invention relates to a semiconductor device and an electronic system having a plurality thereof disposed on a mounting board.

CPU boards have been developed having a microprocessor (CPU) and it coprocessors mounted thereon to form an electronic system. An example of such coprocessors is a floating point unit.

The semiconductor chips that include the microprocessor and coprocessors mentioned above are usually accommodated in a pin grid array (PGA) each. A semiconductor device of a PGA construction may have between tens and hundreds of external pins disposed around its periphery. In other words, the semiconductor device of the PGA construction is suitable for accommodating a semiconductor chip such as a microprocessor or a coprocessors dealing with numerous signals.

Electronic systems of this king incorporating microprocessors and coprocessors are illustratively found in pp. 123-138 of "Nikkei Electronics," of the July 13, 1987 issue.

The microprocessor and coprocessors to be mounted on the board of an electronic systems such as those cited above are each designed and developed separately. That is, the arrangement of external pins of semiconductor devices based on the PGA construction has not been standardized. For this reason, it has been impossible for the board of such microprocessors or coprocessors to dispose linearly, for example, the conductors carrying clock or coprocessors signals between the corresponding external pins. These conductors must be installed over long distances and/or disposed so as to cross other signal conductors. This has led to increases in both capacity and resistance of the signal conductors, causing delays in signal transmission. Because a CPU and its coprocessors perform synchronized transfer between them, clock skews that may occur between the CPU and any of its coprocessors or between coprocessors can cause a malfunction of the system and hamper high-speed operations thereof. In particular, because the clock and coprocessors signals are respectively the reference signal and the signal of the highest velocity in an electronic system, any delay in these signals necessarily reduces the overall performance of the entire system.

Delays in the above-mentioned coprocessor signals or clock signals disrupt the timing of the operation by the electronic system. This can result in system malfunction of the electronic system and reduce the electrical reliability thereof.

There has been no special consideration given to the arrangement of external pins of those semiconductor devices of the PGA construction which accommodate the above-described microprocessor and coprocessors. That is, the external pins that transmit the data bus and address bus signals over bus lines are arranged more or less randomly around the external pins for clock signals. When any of the data bus and address bus signals changes in signal level, the clock signals suffer from a noise by electromagnetic induction on the external pins for those signals. The noise distorts the waveform of the clock signals. Where he clock signals are of a low-frequency type, low levels of distortion of the clock signal waveform do not affect the performance in any appreciable manner. However, where a high-frequency signal is used in a system having a clock-synchronized bus, even very low levels of distortion in the clock signal waveform can trigger system malfunction. For example, in an electronic system that this inventor was developing, clock signals of as high as 40 MHz were adopted to implement higher operation speeds and more frequent bus cycle reiteration. Clock signals operating on such a high frequency to activate the microprocessor and its coprocessors involved led to frequent system malfunction.

SUMMARY OF THE INVENTION

It is therefore an object of the present invention to provide a technology whereby the operation speed of an electronic system having a microprocessor and its coprocessors mounted on a board may be increased.

It is another object of the present invention to provide a technology whereby the above-mentioned electronic system may reduce the incidence of malfunction in the system and improve the electrical reliability thereof.

It is still another object of the present invention to provide a semiconductor device which accomplishes the foregoing objects.

The above and other related objects and features of the invention, as well as the novelty thereof, will clearly appear from the following description and form the accompanying drawings.

Below is an outline of what is disclosed by the present invention.

In an electronic system having a first and a second semiconductor device mounted on a board as a = microprocessor and its coprocessor, respectively, there are provided signal conductors which are substantially linear on that board. Either the signal conductors are connected to the external pins with clock signals assigned thereto of the first semiconductor device, or the signal conductors are connected to the external pins with coprocessor signals assigned thereto of the second semiconductor device.

In the first and the second semiconductor device each having external pins arranged in a matrix of m rows by n columns, with the l—th column of the first semiconductor device comprising external pins having clock or coprocessor signals assigned thereto, the corresponding external pins for the second semiconductor device fall on one of the (l−1)th column, l—th column and (l+1)th column.

On the same row and the same column of the first and the second semiconductor each, there are disposed external pins for clock or coprocessor signals.

Of the external pins of the first and the second semiconductor device, those disposed close to the clock signal conductors mounted on the board are connected to a fixed potential.

The external pins located around those for clock signals of the first and the second semiconductor device are also connected to a fixed potential.

The first and the second semiconductor device are each formed of a rectangular semiconductor chip with a plurality of external pins surrounding the sides thereof. Of these external pins, those on one side of the semiconductor chip and/or those on the opposite side thereof are the external pins for dealing with clock or coprocessor signals.

By use of the means and arrangements outlined above, it is possible to shorten the length of the signal conductors for clock or coprocessor signals disposed on the board, thereby reducing delays in signal transmission and improving the operation speed of the electronic system accordingly.

Where the first and the second semiconductor device are mounted on the board, it is possible to locate the external pins for clock signals and those for coprocessor signals in a substantially linear manner.

The surroundings of the external pins for clock signals are electromagnetically shield d by means of fixed potential connection. This reduces the amount of noise generated into clock signals when the data bus signal is switched in signal level. Lowered noise levels in turn translate into the prevention of system malfunction, improving the electrical reliability of the electronic system.

The surroundings of the clock signal conductors on the board are electromagnetically shielded by means of fixed potential connection. This reduces the amount of noise generated into clock signals when the data bus signal is switched in signal level. Lowered noise levels again translate into the prevention of system malfunction and help improve the electrical reliability of the electronic system.

What follows is a description of a preferred embodiment according to the present invention. Throughout the drawings attached to facilitate the understanding of the embodiment as it si described, like reference characters designate like or corresponding parts. Repetitive portions of the description are omitted on the understanding that they can be readily and clearly inferred in the context.

BRIEF DESCRIPTION OF THE DRAWINGS

FIG. 6 is a schematic showing the functions of the external pins which are disposed on a microprocessor and depicted in FIG. 4;

FIG. 7 is a schematic showing the functions of the external pins which are disposed on a coprocessor and depicted in FIG. 4;

DESCRIPTION OF THE PREFERRED EMBODIMENT

Figure 2:
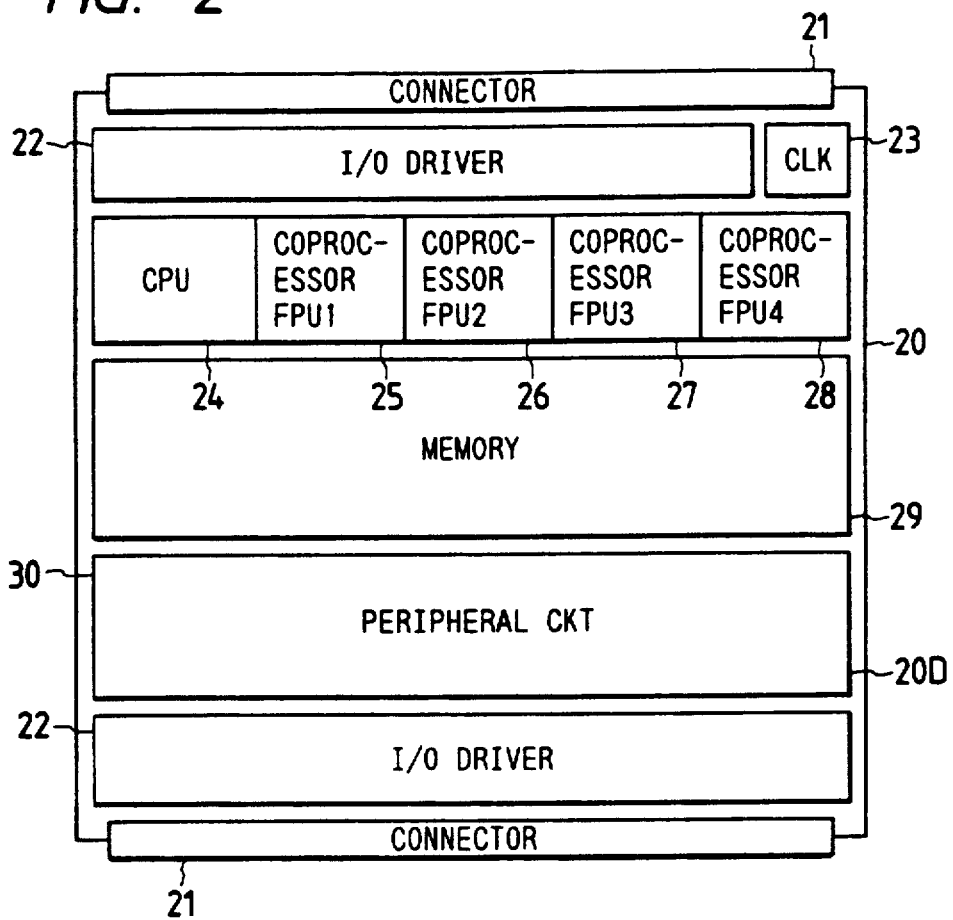
FIG. 2 is a block diagram of the electronic system.

FIG. 2 is a block diagram that outlines an electronic system which is a preferred embodiment of the present invention. Shown in this figure is a CPU board that accommodates the electronic system 20 incorporating float-point units (FPU's) 25-28. On a mounting surface 20D of the board, there are provided connectors 21 shown at top and bottom of the figure. The connectors 21 are capable of connecting the electronic system 20 to external equipment. Between the upper and lower connectors, the mounting surface 20D contains I/O driver circuits 22, a clock generator (CLK) 23, a microprocessor (CPU) 24, coprocessors (FPU1-FPU4) 25 through 28, a memory circuit 29, and a peripheral circuit 30.

One I/O driver circuit is located close to one of the upper and lower connectors 21, and the other I/O driver circuit close to the other connector. Each I/O driver circuit 22 comprises a plurality of semiconductor devices each illustratively formed of a semiconductor chip sealed in a dual in-line package (DIP).

The clock generator (CLK) 23 is located close to the upper I/O driver circuit 22. This generator is a circuit that generates clock signals (system clock signals) that define the timing at which the electronic system 20 operates.

The memory circuit 29 is located in the middle of the mounting surface 20D of the electronic system 20. This circuit comprises a plurality of semiconductor devices (semiconductor memories) each illustratively formed of a semiconductor chip (DRAM, SRAM, etc.) sealed in a DIP.

The peripheral circuit 30 is disposed between the memory circuit 29 and the lower I/O driver circuit 22. As with the I/O driver circuits 22 and memory circuit 28, the peripheral circuit 30 comprises a plurality of semiconductor devices each illustratively formed of a semiconductor chip sealed in a DIP.

Figure 1:
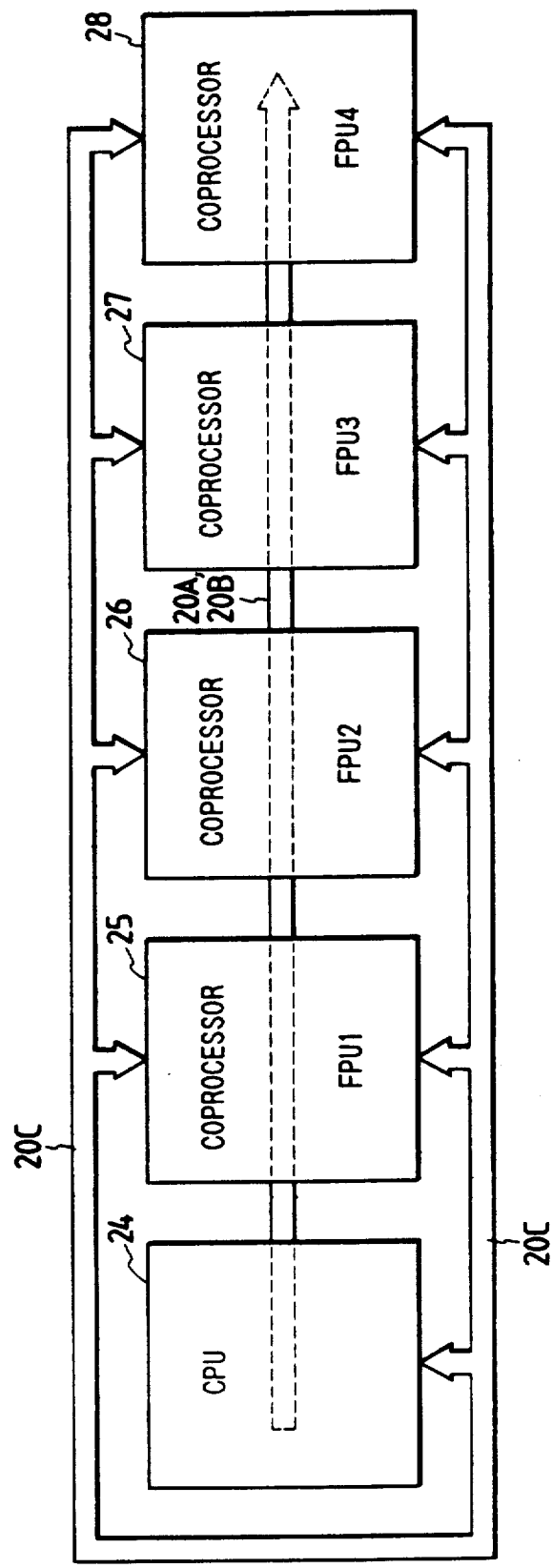
FIG. 1 is a block schematic diagram of major components constituting an electronic system which is a preferred embodiment of the present invention.

The microprocessor 24 and the coprocessors 25 through 28 are located between the memory circuit 29 and the upper I/O driver circuit 22 on the mounting surface 20D. In this embodiment, the electronic system 20 comprises one microprocessor 24 and four coprocessors 25 through 28. As depicted in FIGS. 1 and 2, the microprocessor 24 and the coprocessors 25 through 28 are disposed crosswise in a substantially linear manner.

Figure 3:
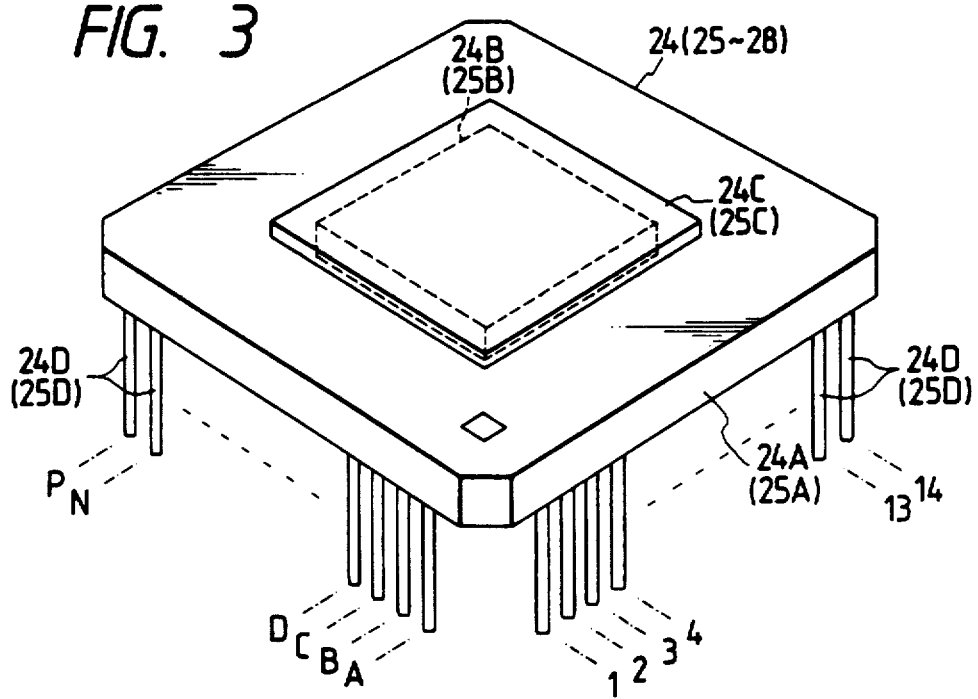
FIG. 3 is a perspective view of a semiconductor device incorporated in the electronic system.
Figure 4:
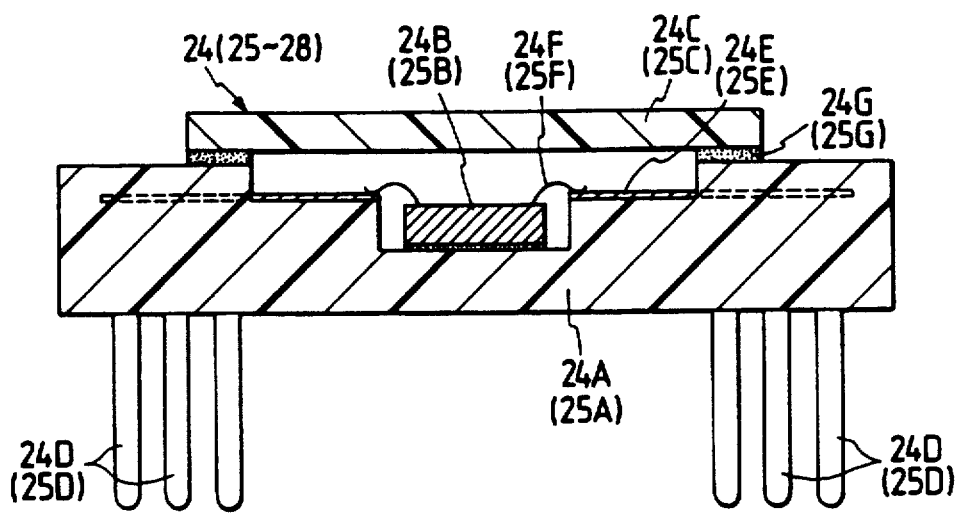
FIG. 4 is a cross-sectional view of the semiconductor device.

As shown in FIGS. 3 and 4, the microprocessor 24 and the coprocessor 25 are each formed of a semiconductor device that adopts a PGA construction. Specifically, the microprocessor 24 and the coprocessor 25 are each made up of a semiconductor chip 24B (25B) placed in a cavity substantially in the middle of a baseboard 24A (25A) and sealed with a sealing cap 24C (25C). The semiconductor chip 24B (25B) is illustratively formed of a plane, monocrystal silicon substrate in rectangular shape. The baseboard 24A (25A) is illustratively formed of a plane ceramic board in substantially square shape (a rectangular shape is also possible). The baseboard 24A (25A) is not restricted to ceramic in terms of material; and the board may also be formed of a plastic material. Because the cavity is provided on the face of the base board 24A (25A), the semiconductor chip 24B (25B) is located on the component side thereof.

Figure 5:
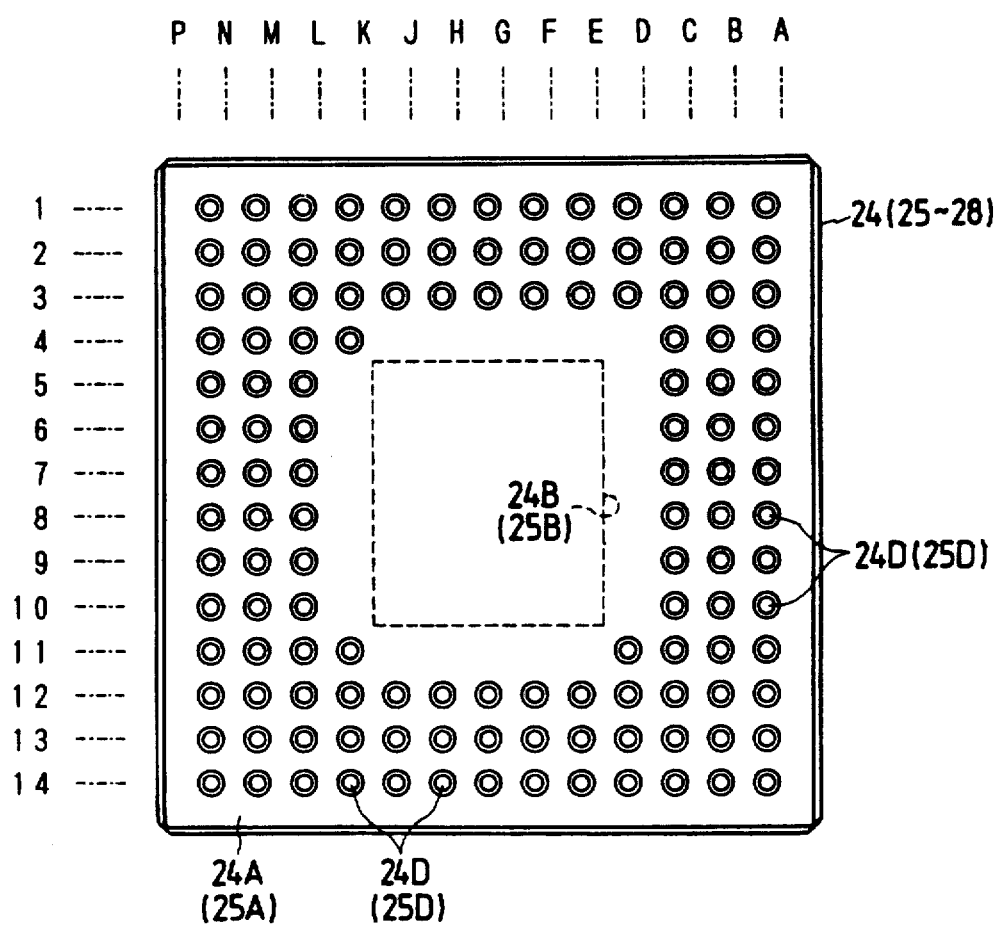
FIG. 5 is a bottom view of the semiconductor device.

As shown in FIGS. 3, 4 and 5, the back (mounting side) of the baseboard 24A (25A) has a plurality of external pins 24D (25D). These pins project perpendicularly from the back of the baseboard 24A (25A). As depicted in FIG. 5, the external pins 24D (25D) are disposed regularly along the four sides of the semiconductor chip 24B (25B). More specifically, the external pins 24D (25D) are arranged in a matrix of m rows by n columns on the back of the baseboard 24A (25A). In the middle of the baseboard is an area reserved to accommodate a semiconductor chip. There are no external pins in this area.

The microprocessor 24 and the coprocessor 25 of this embodiment each contain a semiconductor device of the PGA construction in a matrix of 14 rows by 14 columns having, but not limited to, 135 external pins 24D (25D). The functions of the external pins 24D (25D) in FIG. 5 for the microprocessor and those for the coprocessor are shown in FIGS. 6 and 7, respectively. Of the rows A through P (14 rows) shown in FIGS. 6 and 7, any row crossing any of the columns shown points to the function that corresponds to that of the external pin 24D (25D) in the corresponding location in FIG. 5.

In the case of the microprocessor in FIG. 6, the external pins 24D to the right of the semiconductor chip 24B are each assigned such signals as a reference potential Vss (GND), a power supply potential Vcc and coprocessor signals. Which signals correspond to which coprocessor signals will be described later. The external pins 24D to the left of the semiconductor chip 24B are each assigned such signals as a reference potential Vss, a power supply potential Vcc and clock signals CLKf and CLK2f. The external pins 24D on the top and bottom sides of the semiconductor chip 24B are assigned a data bus signal D0–31 and an address bus signal A0–A29.

The signal pins provide the following functions:

1. A0–29 (pins A2–A29) [Output (tri-state): address bus]

Output a 32-bit address bus signal. This signal indicates an address during a data transfer cycle, an interruption level during an interruption acknowledge cycle, and a coprocessor ID number during coprocessor instruction transfer.

2. $\overline{BCO}$-3 [Output (tri-state): bus control]

Output a byte control signal. This signal indicates the location of effective byte data on the data bus.

3. D0–31 [Input/output (tri-state): data bus]

Input and output a 32-bit data bus signal.

4. $\overline{AS}$ [Output (tri-state): bus control]

Outputs an address strobe signal. This signal indicates that an effective address has been output onto the address bus.

5. $\overline{BS}$ [Output: bus control]

Outputs a bus cycle start signal which indicates the start of a bus cycle. The signal lasts for one machine cycle.

6. $\overline{DS}$ [Output (tri-state): bus control]

Outputs a data strobe signal indicating that there is effective data on the data bus.

7. R/$\overline{W}$ [Output (tri-state): bus control]

Outputs a read/write data signal that indicates the direction f data transfer.

8. $\overline{DC}$ 8 Input: bus control]

Inputs a data transfer complete signal given by an external device. In a data read operation, the signal indicates that the external device has placed effective data was on the bus. In a data write operation, the signal indicates that the external device has received data.

9. $\overline{ASCD}$ [Input: bus control]

Inputs an a synchronous data transfer complete signal given by an external device. In a data read operation, the signal indicates that the external device has placed effective data on the bus. In a data write operation, the signal indicates that the external device has received data. This asynchronous signal is not to be used where FPU's are utilized.

10. RNG [Output: bus control]

Outputs a ring signal, which is a static signal. The MSB (corresponding to ring levels 0 and 1) in the RNG field of the PSW is output.

11. $\overline{GBR}$ [Output: bus arbitration

Outputs a global bus request signal. This signal indicates that the microprocessor is requesting the right to use the global bus. The signal is output when an interruption of interruption level 0 has occurred.

12. $\overline{HREQ}$ [Input: bus arbitration]

Inputs a hold request signal given by an external device requesting the bus right.

13. $\overline{HACK}$ [Output: bus arbitration]

Outputs a hold acknowledge signal indicating that the bus right is passed on o an external device.

14. $\overline{RESET}$ [Input: system control]

Inputs a reset signal that retests the internal status of the processor.

15. $\overline{HALT}$ [Input/output (open drain): system control]

Inputs and outputs a halt signal. When this signal is input, the current bus cycle is allowed to come to its end without subsequent entry into a new bus cycle. The signal is output in case of a system error.

16. $\overline{FLAT}$ [Input: system control]

Inputs a float signal. When input, this signal unconditionally brings the external pins of the microprocessor to the high impedance state. The signal functions independent of other signals.

17. $\overline{PURGE}$ [Input: interruption, cache control]

Inputs an internal cache purge signal given by an external device. This signal indicates that the external device is requesting the purge of the internal cache memory. When the request is serviced, all built-in cache memory of the CPU is purged.

18. $\overline{NCA}$ [Input/output (open drain): cache control]

Inputs and outputs a non-cachable signal. While this signal is being input, no data is allowed to be taken into the internal cache. While the signal is being output, the NC (non-cachable) bit in the page table is made active upon access to the page that was set or upon output of an LOC signal.

19. IRL0–2 [Input: system control]

Inputs an interrupt request signal. This is an interrupt request for use on any of the eight levels encoded with three signal conductors. Level 0, the highest level, is not masked for interruption.

20. $\overline{BST}$ [Input: system control]

Inputs a bus status signal given by an external signal. When brought high, the signal indicates that the external device is in a normal bus cycle. When brought low, the signal indicates that something is wrong. The cause of the error is informed by a DTC half a clock signal later.

21. DCT [Input: system control]

Inputs a data transfer complete type signal given by an external device. The signal is used by the external device to indicate the results of retries and bus access errors during bus transfer.

22. $\overline{LOC}$ [Output (tri-state): processor control]

Outputs a bus lock signal indicating that a plurality of contiguous bus cycles cannot be divided. This signal is used during a read modify write cycle. The signal is output when an instruction BSETI, BCLRI or CSI is executed.

23. BAT0–2 [Output (tri-state): processor control]

Output an access type signal indicating the type of the current bus cycle.

24. CPST0–2 [Input: processor control]

Input a coprocessor status signal indicating the status of the coprocessor at a given point in time.

25. $\overline{CDE}$ [Output: processor control]

Output a coprocessor data enable signal. The signal specifies that data is to be placed on the data bus in the next bus cycle.

26. $\overline{\text{CPDC}}$ [Input: processor control]

Inputs a coprocessor data transfer complete signal. In a data rad operation, the signal indicates that the coprocessor has placed effective data on the bus. In a data write operation, the signal indicates that the coprocessor has admitted data.

27. CLKf, 2f [Input: clock]

Input a system clock signal. With the 20 MHz version, a 20 MHz clock signal is input by means of CLKf, and a 40 MHz clock signal is admitted using CLK2f.

In FIG. 6, a coprocessor signal is identified by a diagonal grid pattern, and a data bus signal D0-D31 by a multiple slant pattern.

As shown in FIGS. 5 and 7, the right-hand side of the coprocessor semiconductor chip 25B principally comprises the external pins which receive the reference potential (GND) Vss, power supply potential Vcc, coprocessor signals and hold acknowledge signal $\overline{\text{HACK}}$. The coprocessor signals comprise an address bus signal A27-A29, a byte control signal $\overline{\text{BC0}}$-$\overline{\text{BC3}}$, a bus start signal $\overline{\text{BS}}$, a read/write signal R/$\overline{\text{W}}$, a bus access type signal BAT0-BAT2, a coprocessor data enable signal $\overline{\text{CDE}}$, a coprocessor data transfer complete signal $\overline{\text{CPDC}}$, a data transfer complete signal $\overline{\text{DC}}$, and a coprocessor status signal CPST0-CPST2. In FIG. 7, each coprocessor signal is identified by a dot pattern ($\propto$). An NC represents an unused external pin 25D (free pin).

The address bus signal A27-A29, one of the coprocessor signals, is an input signal that provides an ID for selecting one of the coprocessors 25 through 28. It is assumed from now on that the coprocessor 25 has been selected by this signal.

The byte control signal $\overline{\text{BC0}}$-$\overline{\text{BC3}}$ is a signal that indicates in bytes the location of effective data on the data bus signal D0-D31.

Th bus start signal $\overline{\text{BS}}$ indicates the start of a bus cycle.

The read/write signal R/$\overline{\text{W}}$ is a signal that indicates the direction of data transfer, i.e., whether the microprocessor 24 reads data from an external memory or writes data thereto.

The bus access type signal BAT0-BAT2 is a signal output by the microprocessor 24 indicating the type of access in effect.

The coprocessor data enable signal $\overline{\text{CDE}}$ is a signal that starts a bus cycle of the microprocessor 24 one clock cycle after being asserted. This signal is given by the microprocessor as an output timing acknowledge signal.

The retry signal $\overline{\text{RETRY}}$ is a signal that requests a retry upon error during the ongoing bus cycle.

The to processor data transfer complete signal $\overline{\text{CPDC}}$ is a signal indicating the end of data transfer over the data bus between the microprocessor 24 and th coprocessor 25.

The data transfer complete signal $\overline{\text{DC}}$ is a signal that indicates the end of data transfer over the data bus between the microprocessor 24 and the memory circuit 29, or between the coprocessor 25 and the memory circuit 29.

The bus error signal $\overline{\text{BERR}}$ is a signal indicating that an error occurred during the ongoing bus cycle.

The coprocessor status signal CPST0-CPST2 is a signal that indicates the internal operating status of the coprocessor 25.

The hold acknowledge signal $\overline{\text{HACK}}$ is a signal indicating that the microprocessor 24 relinquished its bus right and entered a hold state.

The reference potential Vss is the grounding potential for each circuit in the system, illustratively zero volts. The power supply potential Vcc is the operating potential for each circuit int eh system, illustratively 5 volts. Both the reference potential Vss and the power supply potential Vcc are fixed to constant potential levels.

The left-hand side of the semiconductor chip 25B in FIG. 7 comprises the external pins 25D to which are applied such signal as the reference potential Vss, power supply potential Vcc, and clock signals CLKf and $\overline{\text{CLKf}}$.

A coprocessor ID signal CPID0-CPID2 supplies an identifier to the coprocessors 25 a through 28 disposed in the electronic system 20.

Each of the clock signals CLKf and $\overline{\text{CLKf}}$ is a reference signal that defines the timing for the internal operation of the system.

The left-hand side of the semiconductor chip 25B also comprises the external pins 25D that handle the reset signal $\overline{\text{RESET}}$, upper data signal UD, lower data signal LD, interrupt request signal $\overline{\text{IRL}}$, and size-16 signal SIZ16.

The reset signal $\overline{\text{RESET}}$ is a signal that stops all processing and initializes all registers in the system.

The microprocessors 24 of this embodiment has its data bus signal formed of 32 bits. The upper data signal UP and the lower data signal LD are each address signals used only when the data bus signal is set for 16 bits. The upper data signal UD is a switching signal that causes the high-order 16 bits of the data bus signal to be output. The lower data signal LD is a switching signal that causes the low-order 16 bits of the data bus signal to be output.

The size-16 signal SIZ16 is an input signal that sacrifices whether the data bus signal is to be formed of 32 bits or 16 bits.

The coprocessor and clock signal external pins 25D of the coprocessor are located in the same locations or on the same columns as, or ion the adjacent columns of, the coprocessor and clock signal external pins of the microprocessor. For example, the byte control signal $\overline{\text{BC0}}$-$\overline{\text{BC3}}$, one of the coprocessor signals, is assigned to the corresponding external pins at C4, B4, A4 and C5 of both the microprocessor and the coprocessor. The coprocessor data enable signal $\overline{\text{CDE}}$, another coprocessor signal, is assigned to the same column 9, though it is not in the corresponding position. The bus access type signal BAT2, still another coprocessor signal, is assigned to the adjacent columns 6 and 7.

In this manner, the external pins 24D and 25D for the clock and coprocessor signals of the microprocessor and coprocessor (signals common to the microprocessor and its coprocessor) are disposed in the same locations, on the corresponding columns, or on the adjacent columns in the package. This arrangement makes it possible, where the microprocessor and its coprocessor are linearly positioned on the board, to connect their corresponding external pins 24D and 25D linearly. The linear connection illustratively reduces skews in clock signals exchanged between the microprocessor and its coprocessor or between a plurality of coprocessors.

Along the top and bottom sides of the semiconductor chip 25D are principally disposed the external pins 25D which receive such signals as the reference potential Vss, power supply potential Vcc, and data bus signal D0–D31. The data bus signal D0–D31 is a 32-bit input/output data signal. Data is exchanged between the data bus signal (D0–D31) pins of the coprocessor 25 on the one hand, and those of the microprocessor 24 or an external device, illustratively a memory, on the other. Of the external pins D0–D31 for the data bus signal, those to which bits D0–D15 are applied are located along the upper side of the semiconductor chip 25B; those to which bits D16–D31 are applied are located along the lower side of the semiconductor chip 25B. That is, the external pins 25D to which the data bus signal is applied are divided into two groups. One group addresses the high-order 16 bits and the other deals with the low-order b 16 bits, each located on the upper and lower sides of the chip. In FIG. 7, data bus signals D0–D31 are identified by a multiple-slash pattern (/////).

Figure 8:
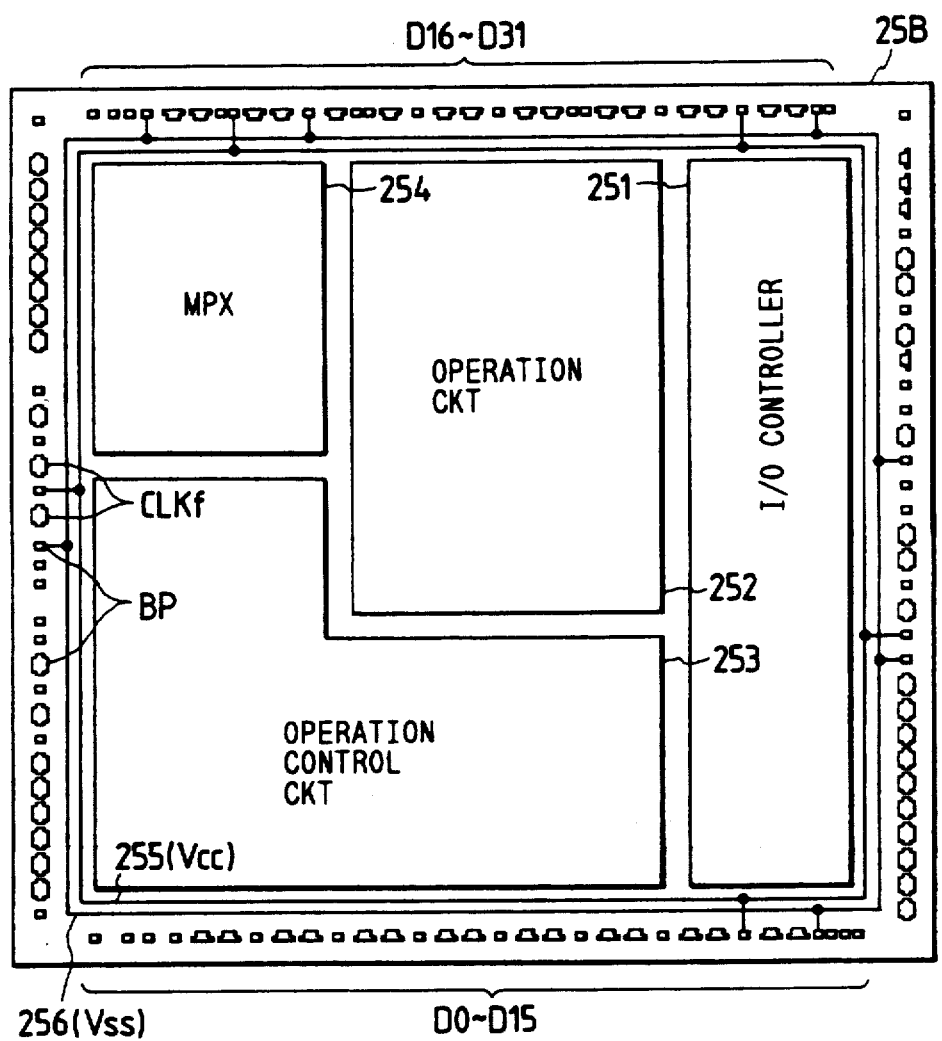
FIG. 8 is a layout plan of a semiconductor chip mounted on the semiconductor device.

As shown in FIG. 8, the semiconductor chip 25B of the coprocessor 25 has its sides lined with bonding pads BP, with circuits disposed within the sides. The semiconductor chip 25B comprises, among other, an I/O controller circuit 251, an operation circuit 252, an operation control circuit 253 and a multiplexer 254.

The bonding pads along the periphery of the semiconductor chip 25B correspond interns of locations to the external pins 5D shown in FIGS. 5 and 7. The arrangement of the bonding pads is spastically the same as that of the external pins. That is, along the right-hand side of the semiconductor chip 25B in FIG. 8 are principally disposed the bonding pads BP which are associated with coprocessor signals, just like the external pins 25D along the right-hand side of the baseboard 25A in FIGS. 5 and 7. Likewise, the left-hand side of the semiconductor chip 5B has principally the external extension electrodes BP which are associated with the external pins 25D on the left-hand side of the baseboard 25A for such signals as clock signals CLKf and $\overline{CLKf}$. Along the bottom side of the semiconductor chip 25B are also principally disposed the external extension electrodes BP which are associated with the external pins 25D for the data bus signal D0–D15 along the top side of the baseboard 25A. The top side of the semiconductor chip 25B also has principally the external extension electrodes which are associated with the external pins 25D for the data bus signal D16–D31 along the top side of the baseboard 25A. The external extension electrodes BP for the data bus signals D0–D31 are divided into two groups, as with the external pins 25D, to be separately disposed along the top and bottom sides of the semiconductor chip 25B in order to minimize signal delays by means of the connection over the shortest distances to the external pins 25D.

In the arrangement described above, every second external extension electrode of the data bus signals D0–D31 is flanked on both sides by the external pins to which a fixed potential (Vcc or Vss) is applied. This construction prevents the generation of the noise attributable to potential fluctuations over the power supply wiring (Vcc or Vss) during a data bus operation.

Of the external extension electrodes BP, those which are located in the middle of the left-hand side of the semiconductor chip 25B and to which the clock signal CLKf is applied are each flanked on both sides by the external extension electrodes BP (in substantially square shape) to which the fixed potential Vcc or Vss is applied. The flanking external extension electrodes BP are connected to a power supply line 255 or 256 installed between the electrodes and the circuits therein. The power supply line 255 is illustratively made of aluminum, and is connected to the power supply potential Vcc. The power supply line 256 is illustratively made of aluminum as well, and is connected to the reference potential Vss. The adding of the external extension electrodes BP to which the fixed potential is applied for noise prevention is not limited to those electrodes to which the clock signal CLKf is applied. The electrodes with the fixed potential also flank each of the external extension electrodes BP handling coprocessor signals in the semiconductor chip 25B of this embodiment.

As illustrated in FIG. 4, the external extension electrodes BP disposed along the sides of the semiconductor chip 25B are connected to the external pins 25D via bonding wires 25F, lead wires 25E, and through-hole wires (not shown).

Meanwhile, the coprocessor of this embodiment would have preferably been mounted on a microprocessor chip. Instead, those functions that are difficult to incorporate in a single microprocessor chip due to constraints of the current production technology or to requirements in the degree of integration are implemented separately in a discrete LSI chip that operates on special control logic. This LSI chip constitutes each coprocessor that is closely coupled with the microprocessor and plays a significant role is executing the latter's instruction.

Because the coprocessors 26 through 28 have substantially the same construction as the coprocessor 25, descriptions will not be repeated regarding the external pin arrangement and other related aspects of those coprocessors.

Figure 9:
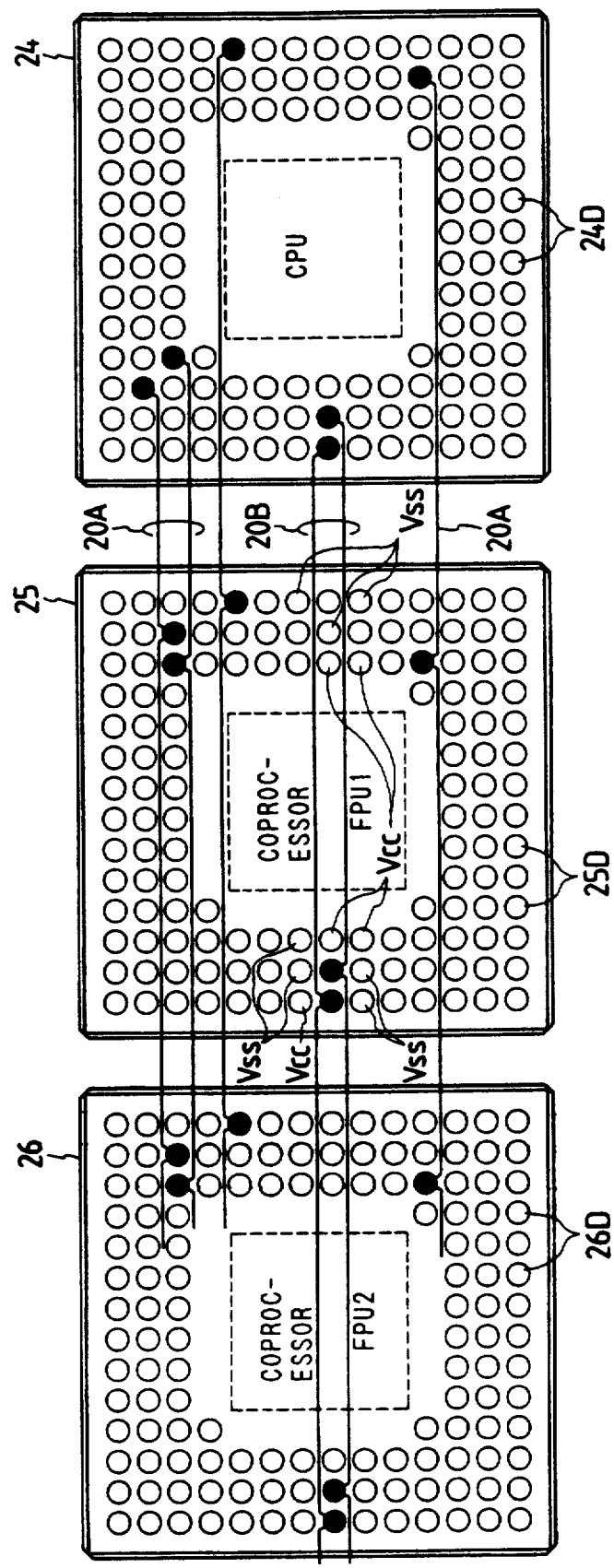
FIGS. 9 and 10 are bottom views of several major semiconductor devices as they are mounted on the electronic system.
Figure 10:
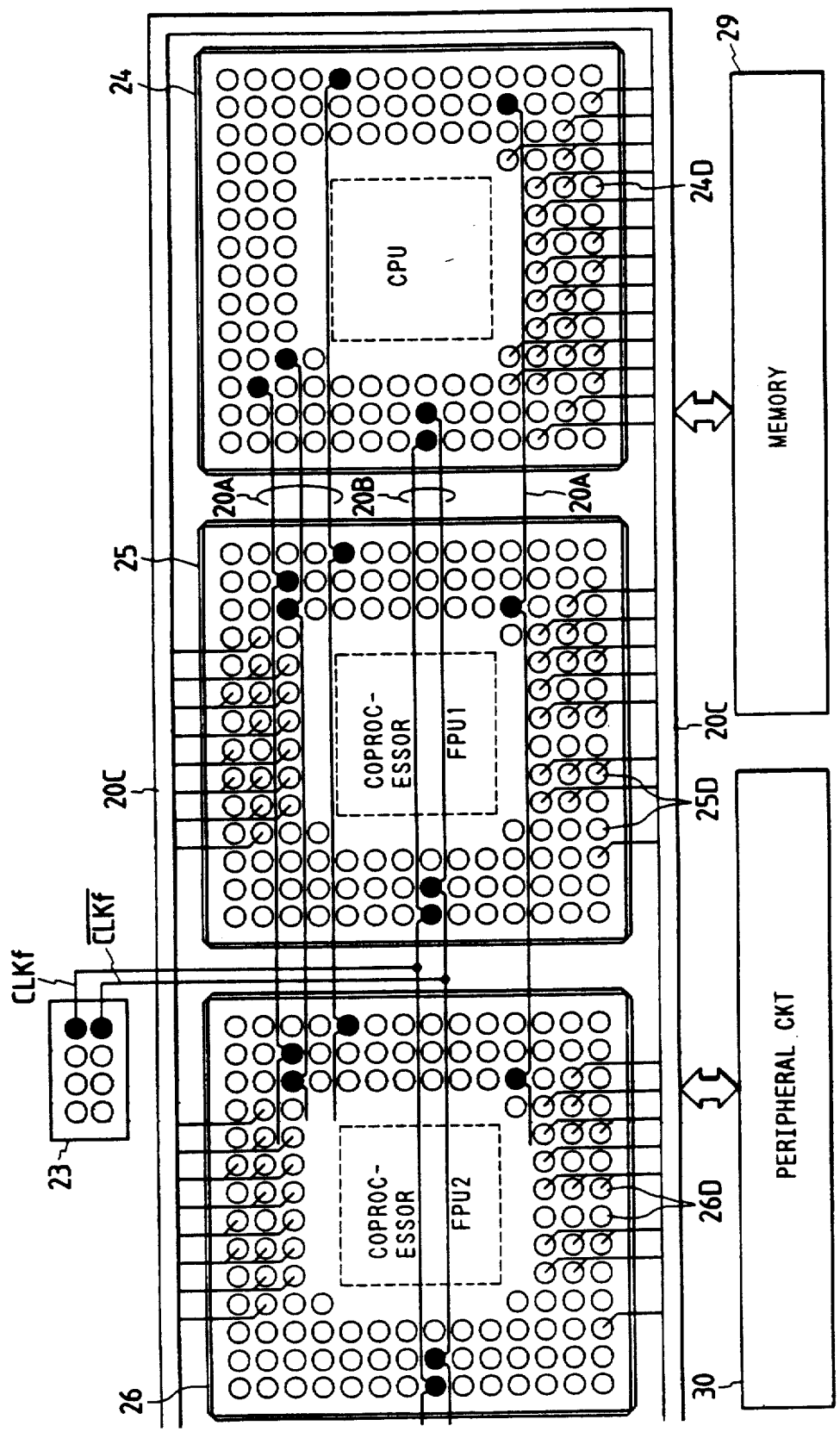

As shown in FIGS. 1, 2, 9 and 10, the microprocessor 24 and the coprocessors 25 through 28 are each mounted on the mounting surface 20D of the electronic system 20. FIG. 9 mainly depicts the coprocessor and clock signal conductors, and FIG. 10 shows these signal conductors and the bus lines together.

In practice, the coprocessor signal external pins 24D and those 25D through 28D of the microprocessor 24 and the coprocessors 25 through 28, respectively, are arranged so as to fall on the same or the adjacent columns. This is because the microprocessor 24 and the coprocessors 25 through 28 are located on the mounting surface 20D in a substantially linear fashion. As shown in FIGS. 9 and 10 the coprocessor signal external pins 24D and those 25D through 28D of the microprocessor 24 and the coprocessors 25 through 28, respectively, are electrically connected via coprocessor signal conductors 20A that stretch linearly on the mounting surface 20D. Likewise, the clock signal (CLKf) external pins 24D and those 25D through 28D are electrically connected via clock signal conductors 25B that extend linearly. The coprocessor signal conductors 20A and clock signal conductors 20B are each a conductor carrying a high-speed signal that determines how fast the electronic system 20 is to function. These signal conductors can be arranged in a substantially linear manner, as illustrated in FIGS. 9 and 109. In particular, the clock signal (CLKf, $\overline{CLKf}$) conductors 20B are allowed to extend without crossing one another.

In the meantime, the external pins to which data bus signals D0–D31 of the microprocessor 24 and of the coprocessors 25 through 28 are applied are electrically connected via bus lines (signal conductors (20C, as shown in FIGS. 1 and 10. The bus lines 20C are allowed to stretch on both sides of, and at certain distances from, the coprocessor signal conductors 20A and clock signal conductors 20B. Since the external pins (25D, etc.) to which the data bus signal D0-D31 is applied are disposed along the top and bottom sides of each of the semiconductor chips 24B through 28B, the bus lines 20C are allowed to extend along the top and bottom sides of each of the microprocessor 24 and coprocessors 25 through 28. Alternatively, the bus lines 20C may be allocated along the bottom edge of each of the microprocessor 24 and coprocessor 25 through 28 or in an outside area thereof.

The mounting surface 20D illustratively comprises a six-tier conductor layer. The coprocessor signal conductors 20A, clock signal conductors 20B and bus lines 20C are each implemented in any of the six tiers that make up the signal conductor layer.

In the electronic system 20, the first semiconductor device (PGA) acting as the microprocessor 24 and the second semiconductor device (PGA) as the coprocessor 25 (and/or 26 through 28) are mounted on the mounting surface 20D. In this setup, either the clock signal conductors 20B connected to the corresponding clock signal external pins (25D, etc.) of the first and second semiconductor chips, or the coprocessor signal conductors 20A connected to the corresponding coprocessor signal external pins of the same chips, are located on the mounting surface 20D in a substantially linear manner, as shown in FIGS. 9 and 10. This arrangement reduces signal delays by shortening the clock signal conductors 20B or the coprocessor signal conductors 20A on the mounting surface 20D. The reductions in signal delays in turn translate into higher operation speeds of the electronic system 20.

The first and the second semiconductor device have a plurality of external pins (25D, etc.) located on the base board (25A, etc.) along the sides of their respective semiconductor chips (25B, etc.). Along one side of each chip or the one opposite thereto are disposed the coprocessor or clock signal external pins. This makes it possible to locate these external pins in a substantially linear manner on the mounting surface 20D.

Exchanges of the data bus signals D0-D31 and other control signals between the first and the second semiconductor device are performed over the bus lines 20C. As shown in FIGS. 1 and 10, the bus lines 20C are disposed along and apart from the coprocessor signal conductors 20A and clock signal conductors 20B on the mounting surface 20D. This arrangement reduces the amount of cross talk that occurs between the coprocessor signal conductors 20A nd the clock signal conductors 20B, thereby minimizing g system malfunction of the electronic system 20 and boosting the electrical reliability thereof.

As depicted in FIGS. 7 and 9, the external pins (25D, etc.) located around the clock signal external pins (25D, etc.) of the first and the second semiconductor device are connected to the fixed potential Vcc or to ground. This arrangement causes the fixed potential to shield electromagnetically the surroundings of the clock signal external pins. This reduces the amount of noise generated in the clock signal CLKf and $\overline{CLKf}$ upon signal level changeover of the data bus signal D0-D31. Lowered noise levels in turn help significantly to prevent system malfunction of the electronic system 20 and to improve the electrical reliability thereof.

as shown in FIG. 8, a fixed potential is connected to the bonding pads BP disposed around those (BP) to which the clock signals CLKf and $\overline{CLKf}$ are applied on each of the semiconductor chips (25D, etc.) of the first and the second semiconductor device. As in the foregoing arrangement, this also makes it possible to reduce the amount of noise generated in the clock signals CLKf and $\overline{CLKf}$. Lowered noise levels help significantly to prevent system malfunction of the electronic system 20 and to improve the electrical reliability thereof.

As depicted in FIGS. 7 and 9, of the external pins (25D, etc.) of the coprocessors 25 through 28, those that extend close to the clock signal conductors 25B on the mounting surface 20D are connected to a fixed potential. That is, as opposed to the left-hand side of each of the coprocessors 25 through 28 having the external pins (25D, etc.) to which the clock signal CLKf is applied, the right-hand side of each coprocessor comprises the external pins to which a fixed potential is applied. As in the foregoing arrangements, this also reduces the amount of noise generated in the clock signals CLKf and $\overline{CLKf}$ over the clock signal conductors 120B on the mounting surface. Lowered noise levels help significantly to prevent system malfunction of the electronic system 20 and to boost the electrical reliability thereof.

as illustrated in FIGS. 9 and 10, in the electronic system 20 have in the coprocessors 25 through 28 disposed on the mounting surface 20D, those clock signal conductors 20B of the coprocessors which are connected to the external pins (25D, etc.) receiving the clock signals CLKf and $\overline{CLKf}$ are located on both sides of, and substantially parallel with, the clock signal external pins in the same direction. This arrangement reduces the amount of crosstalk generated between the clock signal conductors 20B to which eh clock signals CLKf and CLKf are applied. Lowered crosstalk level s in turn improve the electrical reliability of the electronic system 20.

It is to be understood that while the invention has been described in conjunction with a specific embodiment, it is evident that many alternatives, modifications and variations will become apparent to whose skilled in the art in light of the foregoing description. Accordingly, it is intended that the present invention embrace all such alternatives, modifications and variations as fall within the spirit and scope of the appended claims.

Illustratively, according to the present invention, coprocessors such as a memory management unit (MMU) and a decimal processing unit (DPU) may be incorporated in the electronic system 20 in place of the FPU's.

Also according to the invention, the microprocessor 24 nd the coprocessors 25 through 28 may be each replaced by a semiconductor device of a OLCC (plastic leaded chip carrier), QFP (quad flat package) or LCC (leadless chip carrier) construction. In other words, what may be called a four-side package having numerous external pins is suitable for embodying the invention.

Also according to the invention, the number of the microprocessor and its coprocessors in the electronic system 20 is not limited to that of the preferred embodiment; the number may be varied in alternative embodiments.

The principal benefits, among another, of the invention disclosed in this specification is twofold: the operation speed of the electronic system is boosted, and the electrical reliability thereof is improved.

What is claimed is:

1. An electronic system comprising:
   a first semiconductor device comprising a microprocessor, said first semiconductor device having a first set of external pins located in a matrix pattern of rows and columns, said first set of external pins containing a subset of external pins which provide predetermined functions;
   a second semiconductor device comprising a coprocessor, said second semiconductor device having a second set of external pins located in a matrix pattern of rows and columns, said second set of external pins containing a subset of external pins which provide said predetermined functions, said first and second semiconductor devices linearly mounted on a mounting board, said second semiconductor device disposed parallel with the rows of said first semiconductor device; and
   wiring means located linearly on said mounting board in the column direction, for electrically connecting said first and second external pins.

2. The electronic system according to claim 1, wherein said first and second semiconductor devices each have m rows by n columns of external pins, said subset of said second set of external pins located in one of (l−1)th, l=th and (l+1)th columns when said subset of said first set of external pins is located on the l−th column, the designation l−th indicating ia selected column, and the designation (l−1)th and (l+1)th indicating preceding and succeeding columns to the l−th column.

3. The electronic system according to claim 2, wherein said subsets of said first and second sets of external pins are for coprocessor signals.

4. The electronic system according to claim 2, wherein said subset of said second set of external pins are locate don the l−th column.

5. The electronic system according to claim 4, wherein said subset of said second set of external pins are located on a k-th column when said subset of said first set of external pins are located on the k-th column, the designation k-th being a general manner of indicating a particular column.

6. The electronic system according to claim 5, wherein said subsets of said first and second sets of external pins are for clock signals.

7. The electronic system according to claim 1, further comprising:
   a third semiconductor device having a third set of external pins disposed in a matrix pattern and said third set of external pins containing a subset of external pins which provide predetermined functions; and
   further wiring means for electrically connecting said subsets of said second and third sets of external pins disposed on said mounting board, wherein said first, second and third semiconductor devices are disposed linearly, said wiring means and further wiring means extending in a linear fashion.

8. The electronic system according to claim 7, wherein said first, second and third semiconductor devices each have m rows by n columns of external pins, said subsets of said second and third sets of external pins located on one of (l−10)th, l−th and (l+1)th columns when said subset of said first set of external pins are located on the l−th column the designation l−th indicting any selected column, and the designations (l−11)th and (l+1)th indicating preceding and succeeding columns to the l−th column.

9. The electronic system according to claim 8, wherein said subsets of said first, second and third sets of external pins are for coprocessor signals.

10. The electronic system according to claim 9, wherein said subsets of said second and third sets of external pins are located on the l−th column.

11. The electronic system according to claim 10, wherein said subsets of said second and third sets of external pins are located in a k-th column when said first external pins are located on the k-th column, the designation k-th being a general manner of indicating particular column.

12. The electronic system according to claim 11, wherein said subsets of said first, second and third sets f external pins are for coprocessor signals.

13. An electronic system having a semiconductor device located on a mounting board, the system comprising:
   said semiconductor device having a plurality of first external pins disposed in a matrix pattern of rows and columns, said plurality of first external pins containing a subset of external pins which are for providing clock signals; and
   wiring means disposed on said mounting board, electrically connected between a fixed potential and external pins which are close to the subset of the first plurality of external pins.

14. The electronic system according to claim 13, wherein said fixed potential is at least one of a reference potential and a coprocessor.

15. The electronic system according to claim 14, wherein said semiconductor device is at least one of a microprocessor and a coprocessor.

16. A semiconductor device comprising:
   a semiconductor chip;
   a baseboard having said semiconductor chip mounted thereon;
   a plurality of first external pins which project form said baseboard in a matrix pattern of rows and columns the first plurality of external pins containing a first subset of external pins for receiving clock signals; and
   a means for connecting a second subset of the first plurality of first external pins adjacent to said first subset of said first plurality of external pins with a fixed potential.

17. The semiconductor device according to claim 16, wherein said fixed potential is at least one of a reference potential and a power supply potential.

18. A semiconductor device comprising:
   a rectangular semiconductor chip providing coprocessor functions;
   a rectangular baseboard having said semiconductor chip mounted in the middle thereof; and
   a plurality of external pins which project from said baseboard, disposed in a matrix pattern of rows and columns on said baseboard, and which are located on the periphery of said semiconductor chip, wherein said external pins comprise two groups of external pins for data bus signals located along two opposite sides of said rectangular baseboard, and a group of external pins for coprocessor signals located along at least one of the remaining two sides of said rectangular baseboard.

19. The semiconductor device according to claim 18, wherein external extension electrodes for data bus signals are disposed along two opposite sides of said rectangular semiconductor chip, further external extension electrodes for coprocessor signals being disposed along at least one of the two remaining sides of said chip.

20. The semiconductor device according to claim 19, wherein along two opposite sides of said rectangular semiconductor chip having said external extension electrodes for data bus signals, there are dispose only said external extension electrodes for data bus signals and further external extension electrodes for supplying a fixed potential.

21. The semiconductor device according to claim 20, wherein on both sides of said external extension electrodes for data bus signals are disposed external extension electrodes for supplying a fixed potential.

22. An electronic system comprising:
a mounting board;
a first microprocessor semiconductor device and a coprocessor semiconductor device, each of which has m rows by n columns of external pins which are linearly mounted on said mounting board, said coprocessor semiconductor device being mounted parallel with the rows of said microprocessor semiconductor device, said microprocessor semiconductor device having second external pins which provide said predetermined functions, said coprocessor semiconductor device having second external pins which provide said predetermined functions, said second external pins are located in one of (l−1)th, l−th, and (l+1)th columns when said first external pins are located on the l−th column, where l−th represents a selected column and (l−1)th and (l+1)th represents columns succeeding and preceding the l−th column;
wiring means disposed on said mounting board for electrically connecting said first and second external pins.

23. In an electronic system in which a plurality of semiconductor chips of at least first and second types each having at least one row of external pins are mounted through a mounting board with the rows of external pins in parallel and in which a first wiring path on the mounting board connects a first external pin of each semiconductor device and a second wiring path on the mounting board connects a second pin of each semiconductor device, the improvement comprising:
manufacturing the first and second types of semiconductor chips with the first external pin of each in a first common position along its row of external pins and with the second external pins of each in a second common position along its row of external pins; and
wherein the first and second wiring paths extend substantially linearly and parallel to each other along the mounting board in a direction substantially orthogonal to the parallel rows of pins, whereby eliminating crossing of the first and second wiring paths reduces cross talk and facilitates higher operating speeds.

* * * * *

UNITED STATES PATENT AND TRADEMARK OFFICE
CERTIFICATE OF CORRECTION

PATENT NO. : 4,994,902

DATED : February 19, 1991

INVENTOR(S) : Okahashi et al

Page 1 of 2

It is certified that error appears in the above-identified patent and that said Letters Patent is hereby corrected as shown below:

Claim 2, column 13, line 26, delete "(1-1)th, 1-th and (1+1)th" and insert therefor --($\ell$-1)th, $\ell$-th and ($\ell$+1)th--;
    line 27, delete "1-th" and insert therefor --$\ell$-th--;
    line 28, delete "1-th" and insert therefor --$\ell$-th--;
    line 29, delete "(1-1)th and (1+1)th" and insert therefor --($\ell$-1)th and ($\ell$+1)th--; and,
    line 30, delete "1-th" and insert therefor --$\ell$-th--.

Claim 4, column 13, line 37, delete "locate don the 1-th" and insert therefor --located on the $\ell$-th--.

Claim 8, column 13, line 65, delete "(1-1()th, 1-th and (1+1)th" and insert therefor --($\ell$-1)th, $\ell$-th and ($\ell$+1)th--;
    line 66, delete both occurrences of "1-th" and insert therefor --$\ell$-th--;
    column 14, line 1, delete "(1-11)th and (1+1)th" and insert therefor --($\ell$-1)th and ($\ell$+1)th--;
    line 2, delete "1-th" and insert therefor --$\ell$-th--.

Claim 10, column 14, line 8, delete "1-th" and insert therefor --$\ell$-th--.

Claim 11, column 14, line 13, after "indicating" insert --a--.

Claim 12, column 14, line 16, delete "f" and insert therefor --of--.

Claim 20, column 15, line 8, delete "dispose" and insert therefor --disposed--.

UNITED STATES PATENT AND TRADEMARK OFFICE
CERTIFICATE OF CORRECTION

PATENT NO. : 4,994,902

DATED : February 19, 1991

INVENTOR(S) : Okahashi et al

It is certified that error appears in the above-identified patent and that said Letters Patent is hereby corrected as shown below:

Claim 22, column 15, line 25, after "having" insert --first external pins which provide predetermined functions, said coprocessor semiconductor device having--.

column 15, line 30, delete "(1-1)th, 1-th, and (1+1)th" and insert therefor --($\ell$-1)th, $\ell$-th and ($\ell$+1)th--;
    column 16, line 1, delete "1-th" and insert therefor --$\ell$-th--;
    line 2, delete "1-th" and insert therefor --$\ell$-th--;
    line 3, delete "(1-1)th and (1+1)th" and insert therefor --($\ell$-1)th and ($\ell$+1)th--; and,
    line 4, delete "1-th" and insert therefor --$\ell$-th--.

Signed and Sealed this

Fifteenth Day of September, 1992

Attest:

DOUGLAS B. COMER

*Attesting Officer*      *Acting Commissioner of Patents and Trademarks*